US011680965B2

(12) United States Patent
Felix et al.

(10) Patent No.: US 11,680,965 B2
(45) Date of Patent: *Jun. 20, 2023

(54) DROOP DETECTION

(71) Applicant: Graphcore Limited, Bristol (GB)

(72) Inventors: Stephen Felix, Bristol (GB); Daniel John Pelham Wilkinson, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/814,247

(22) Filed: Jul. 22, 2022

(65) Prior Publication Data

US 2022/0365116 A1   Nov. 17, 2022

Related U.S. Application Data

(63) Continuation of application No. 17/082,667, filed on Oct. 28, 2020, now Pat. No. 11,442,082, which is a continuation-in-part of application No. 16/842,859, filed on Apr. 8, 2020, now Pat. No. 11,449,117.

(30) Foreign Application Priority Data

Dec. 23, 2019 (GB) ..................... 1919151

(51) Int. Cl.
*G06F 1/06* (2006.01)
*G01R 19/165* (2006.01)
(Continued)

(52) U.S. Cl.
CPC ....... *G01R 19/16504* (2013.01); *G01R 17/02* (2013.01); *G01R 19/16552* (2013.01); *G06F 1/06* (2013.01); *H03K 5/14* (2013.01)

(58) Field of Classification Search
CPC .............. G01R 19/16504; G01R 17/02; G01R 19/16552; G06F 1/06; H03K 5/14
See application file for complete search history.

(56) References Cited

U.S. PATENT DOCUMENTS

| 4,344,036 A | 8/1982 | Dakroub |
| 9,503,068 B1 | 11/2016 | DiBene |
| (Continued) | | |

FOREIGN PATENT DOCUMENTS

| JP | 2000200114 | 7/2000 |
| JP | 2005242570 | 9/2005 |
| (Continued) | | |

OTHER PUBLICATIONS

Combined Search and Examination Report dated May 28, 2020 for Patent Application No. GB1919151.9.
(Continued)

*Primary Examiner* — Gary Collins
(74) *Attorney, Agent, or Firm* — Haynes and Boone, LLP

(57) ABSTRACT

During normal operation of a processor, voltage droop is likely to occur and there is, therefore, a need for techniques for rapidly and accurately detecting this droop so as to reduce the probability of circuit timing failures. The droop detector described herein uses a tap sampled delay line in which a clock signal is split along two separate paths. Each of the taps in the paths are separated by two inverter delays such that the set of samples produced represent sample values of the clock signal that are each separated by a single inverter delay without inversion of the first clock signal between the samples.

20 Claims, 9 Drawing Sheets

(51) Int. Cl.
H03K 5/14 (2014.01)
G01R 17/02 (2006.01)

(56) References Cited

U.S. PATENT DOCUMENTS

| | | |
|---|---|---|
| 2014/0002047 A1 | 1/2014 | Houston et al. |
| 2015/0355671 A1 | 12/2015 | Coutts |
| 2016/0033576 A1 | 2/2016 | Turullols |
| 2017/0261537 A1 | 9/2017 | Chong |
| 2017/0301381 A1 | 10/2017 | Seomun |
| 2017/0329391 A1 | 11/2017 | Jaffari |
| 2018/0018009 A1 | 1/2018 | Kommrusch |
| 2018/0232043 A1 | 8/2018 | DiBene, II |
| 2020/0192456 A1* | 6/2020 | Sugumar ............... G06F 1/10 |

FOREIGN PATENT DOCUMENTS

| | | |
|---|---|---|
| JP | 2017058911 | 3/2017 |
| JP | 2017224811 | 12/2017 |
| JP | 2018523872 | 8/2018 |
| WO | 2015126790 A1 | 8/2015 |
| WO | 2018048550 A1 | 3/2018 |

OTHER PUBLICATIONS

International Search Report and Written Opinion dated Feb. 10, 2021 for PCT/EP2020/081632.
Office Action dated Jun. 22, 2022 for Chinese application No. 202080045313.2.
Office Action dated Mar. 15, 2023 for JP Patent Application No. 2022-513445. 7 pages.

* cited by examiner

DROOP DETECTION

CROSS-REFERENCE TO RELATED APPLICATIONS

The present application is a continuation of U.S. patent application Ser. No. 17/082,667, filed Oct. 28, 2020, which is a continuation-in-part of U.S. patent application Ser. No. 16/842,859, filed Apr. 8, 2020, which claims priority to United Kingdom Patent Application No. 1919151.9, filed on Dec. 23, 2019, the disclosures of which are incorporated herein by reference in their entireties.

TECHNICAL FIELD

The present disclosure relates to a method and apparatus for detecting voltage droop in a supply voltage for a processor.

BACKGROUND

During operation, a supply voltage is applied to a processor to power the operation of the logic circuits within the processor. The voltage supplied across the processor is referred to as $V_{DD}$. When executing one or more applications on the processor, there are different variables that can affect the voltage drawn by the processor during operation. Such factors include the effective switched capacitance of the processor, and the frequency at which the processor is clocked at. Specifically, it is understood that the impedance, Z, across a processor is related to the effective switched capacitance, $C_s$, and the processor clock frequency, f, by $$Z \propto \frac{1}{C_s f} \quad \text{Equation 1}$$

In a circuit including a power supply and a processor, the processor is not the only source of impedance. The processor is also in series with other sources of impedance, such as, for example, impedance resulting from the internal resistance of the power supply. The processor is, therefore, part of a voltage divider in which the voltage, $V_{DD}$ across the processor increases with the impedance of the processor.

It is, therefore, understood from equation 1 that $V_{DD}$ will rise or fall with changes in the effective switched capacitance and the clock frequency of the processor. These variables will typically not remain constant over the operation of the processor. Therefore, unless the power supply voltage is adjusted to compensate, $V_{DD}$ will vary over the operation of the processor. When changes to $C_s$ and f occur slowly, it is possible to adjust the output of the power supply to keep $V_{DD}$ above a minimum required level. However, sudden increases in $C_s$ or f can cause $V_{DD}$ to droop suddenly. Such voltage droop may result in timing failures in the processor, which could be fatal for the operation of the processor.

Sudden increases in the processor clock frequency may be caused, for example, by a switch from use of a slow phase locked loop (PLL) to use of a fast phase locked loop (PLL). Such a switch may be performed, for example, to execute an application faster and enable it to deliver its output faster. However, due to the inverse relationship between $V_{DD}$ and the clock frequency, a sudden increase in the clock frequency can cause $V_{DD}$ to droop suddenly.

Sudden increases in the effective switched capacitance may be caused by a change in application behaviour. This may particularly be seen in a processor having a large number of execution units, in which certain events in the processor, such as a synchronisation of data between memories associated with different units, can result in computationally intensive code being executed by the units. An increase in the computational intensity of the executing code results in an increase in the number of switching elements in the processor that are switched every clock cycle. This increase in the amount of switching increases the effective switching capacitance, thus causing a decrease in $V_{DD}$.

SUMMARY

According to a first aspect, there is provided a method for detecting voltage droop in a supply voltage for a processor, the method comprising: receiving at a tap sampled delay line, a first clock signal, wherein the tap sampled delay line is powered by a same power supply that supplies the supply voltage to the processor; splitting the first clock signal along two different paths in the tap sampled delay line; producing a set of samples of the first clock signal by, along each of the two different paths, upon receipt of an edge of a sample clock signal, sampling the first clock signal at each of a set of taps in the respective path, wherein each of the taps in the respective path is separated by two inverter delays such that the set of samples represent sample values of the first clock signal each separated by a single inverter delay without inversion of the first clock signal between the samples; and determining a magnitude of the voltage droop by measuring from the set of samples, a change in a clock edge position of the first clock signal, wherein the sample clock signal has the same frequency as the first clock signal.

In some embodiments, the first clock signal is a delayed version of the sample clock signal.

In some embodiments, the first clock signal is received at the tap sampled delay line is received from a further delay line, wherein the further delay line has coarser delay stages than the tap sampled delay line.

In some embodiments, the tap sampled delay line comprises a plurality of connections between the two different paths for limiting drift of the first clock signal between the two different paths, wherein each of the connections comprises at least one inverter.

In some embodiments, each of the set of taps comprises a pair of flip flops, wherein each pair of flip flops comprises: a first flip flop for sampling the first clock signal to latch a value in response to receipt of the edge of the sample clock signal; and a second flip flop for sampling the latched value as an output of the first flip flop in response to receipt of a subsequent edge of the sample clock signal.

In some embodiments, each of the flip flops comprises ultra-low voltage threshold transistors.

In some embodiments, the step of determining the magnitude of the voltage droop comprises: determining an average clock edge position for the first clock signal in the tap sampled delay line; and determining a deviation in the clock edge position from the average clock edge position.

According to a second aspect, there is provided a method for reactively limiting voltage droop comprising: detecting voltage droop using the method according to the first aspect; receiving from a clock generator, a first processor clock signal for supplying to the processor, the first processor clock signal being of a first frequency; in response to the detected voltage droop in the supply voltage for the processor, generating a second processor clock signal of a second frequency, wherein the second frequency is lower than the first frequency; and providing the second processor clock signal to the processor.

In some embodiments, the step of generating the second processor clock signal comprises removing a proportion of clock pulses from the first processor clock signal.

In some embodiments, the method comprises, following the step of removing the proportion of clock pulses from the first processor clock signal, adjusting the second processor clock signal so as to increase the second frequency, the adjusting the second processor clock signal comprising decreasing the proportion of clock pulses removed from the first processor clock signal.

In some embodiments, the step of, in response to the detected voltage droop, generating the second processor clock signal comprises: determining that the voltage droop exceeds a predefined threshold; and in response to determining that the voltage droop exceeds the predefined threshold, generating the second processor clock signal.

In some embodiments, the method comprises: receiving the second processor clock signal at the processor; and propagating the second processor clock signal along copper wires of the processor for clocking one or more components of the processor.

In some embodiments, the copper wires have a thickness of greater than 0.2 micrometres.

In some embodiments, the one or more components of the processor comprise a plurality of processing units.

According to a third aspect, there is provided an apparatus for detecting voltage droop in a supply voltage for a processor, the apparatus comprising a tap sampled delay line comprising: an input for receiving at the tap sampled delay line, a first clock signal, wherein the tap sampled delay line is powered by a same power supply that supplies the supply voltage to the processor; two different clock paths, each configured to propagate the first clock signal as a differential clock signal; a plurality of taps arranged along each of the two different paths in the tap sampled delay line, the plurality of taps configured to produce a set of samples of the clock signal by, upon receipt of an edge of a sample clock signal, sampling the first clock signal, wherein along each of the different paths, each of the taps in the respective path is separated by at least two inverter delays such that the set of samples represent sample values of the first clock signal each separated by a single inverter delay without inversion of the first clock signal between the samples; and circuitry configured to determine a magnitude of the voltage droop by measuring from the set of samples, a change in a clock edge position of the first clock signal, wherein the sample clock signal has the same frequency as the first clock signal.

In some embodiments, the apparatus comprises clock signal modification circuitry configured to: receive from a clock generator, a first processor clock signal for supplying to the processor, the first processor clock signal being of a first frequency; in response to the detected voltage droop in the supply voltage for the processor, generate a second processor clock signal of a second frequency, wherein the second frequency is lower than the first frequency; and provide the second processor clock signal to the processor.

In some embodiments, the generating the second processor clock signal comprises removing a proportion of clock pulses from the first processor clock signal.

In some embodiments, the apparatus comprises the processor, with the processor being configured to: receive the second processor clock signal; and propagate the second processor clock signal along copper wires of the processor for clocking one or more components of the processor.

In some embodiments, the apparatus comprises a further delay line having coarser delay stages than the tap sampled delay line, wherein the tap sampled delay line is configured to receive the first clock signal from the further delay line.

In some embodiments, the determining the magnitude of the voltage droop comprises: determining an average clock edge position for the first clock signal in the tap sampled delay line; and determining a deviation in the clock edge position from the average clock edge position.

In some embodiments, a method for determining a magnitude of voltage droop in a supply voltage for a processor includes: receiving a first clock signal at a tap sampled delay line that is powered by a same power supply that supplies the supply voltage to the processor; splitting the first clock signal along a first path in the tap sampled delay line and a second path in the tap sampled delay line; producing a set of samples of the first clock signal along the first path and the second path, including sampling the first clock signal at a plurality of taps in the first path and the second path, wherein each tap of the plurality of taps is separated by two inverter delays; and measuring a change in a clock edge position of the first clock signal from the set of samples, wherein a sample clock signal has a same frequency as the first clock signal.

BRIEF DESCRIPTION OF DRAWINGS

For a better understanding of the present disclosure and to show how the same may be carried into effect, reference will now be made to the accompanying drawings in which.

DETAILED DESCRIPTION

Proposals for addressing voltage droop can be divided into two categories: preventative and reactive. Preventative methods involve attempts at preventing the processor from entering a high power state too rapidly. One preventative proposal is to require the cores on a multicore chip to send requests to enter various higher power states to a central controller of the chip. The central controller may then grant them permission to enter those states in a time-staggered manner in order to limit the abruptness of the resulting current step. Since the current step is less abrupt, the power manager has time to raise its supply voltage to adapt to the changing conditions to limit the voltage droop that occurs.

However, it is non-trivial for cores to predict accurately and reliably their future power consumption and also non-trivial to build a low-latency interconnect to the controller.

Reactive methods involve allowing the load steps to occur, but then detecting and curtailing the voltage droop. This has the advantage of not requiring any load prediction mechanism, and can be invoked only when necessary to curtail the droop. The challenge is, how to very rapidly and accurately detect and respond to droop when it occurs. Since a large proportion of the droop occurs over a very short time frame (e.g. 15 ns), it is desirable to detect and curtail the droop as rapidly as possible.

Embodiments provide methods for reactively detecting and rapidly curtailing the voltage droop.

Figure 1:
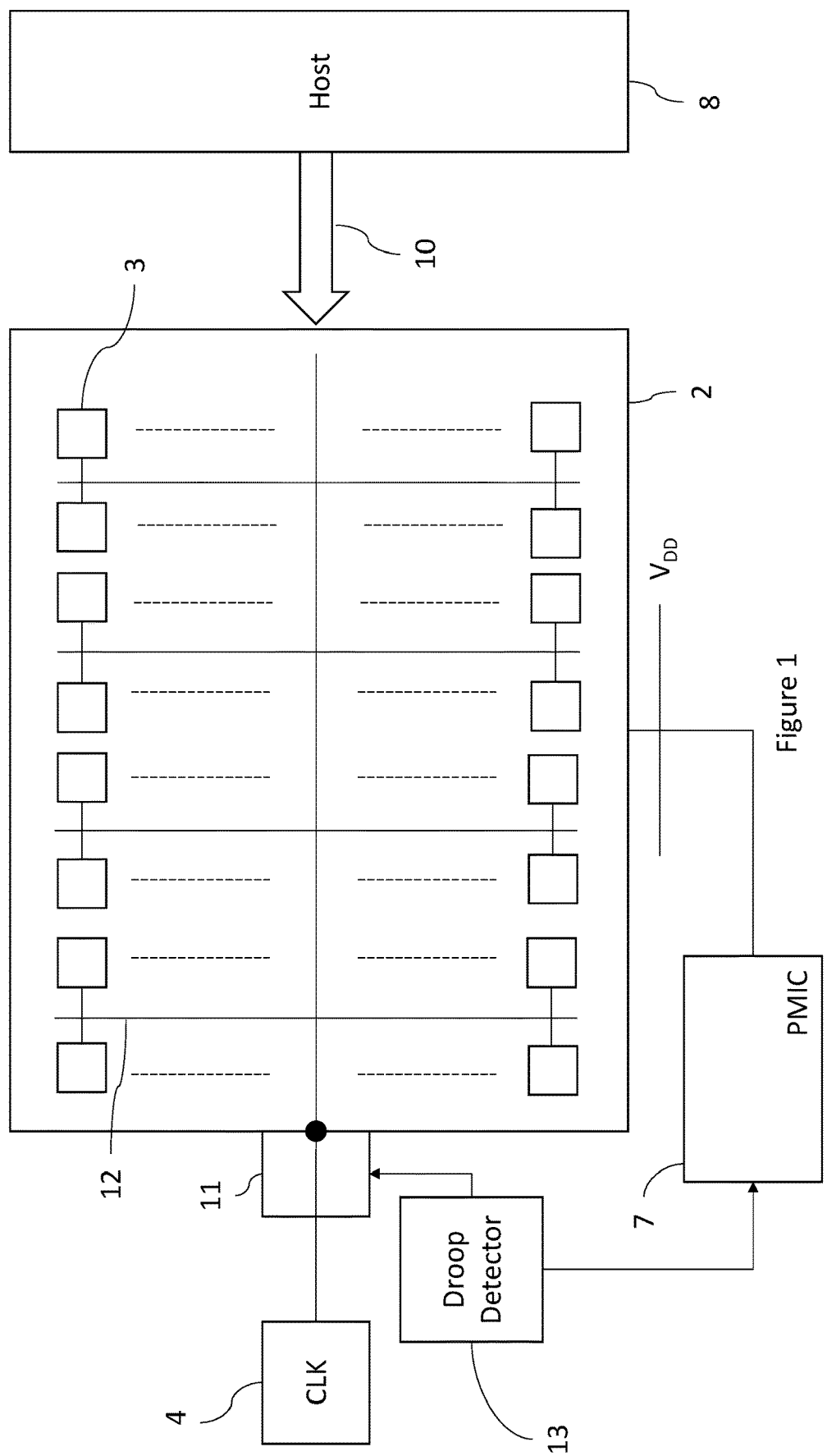
FIG. 1 provides a schematic illustration of a processor with a clock control system for mitigating droop.

FIG. 1 is a schematic block diagram of a computer system, which comprises a processor 2 which may, for example, be a single chip processor comprising multiple processing units (tiles) 3. The processor 2 may be an accelerator which is used to process workloads allocated to it by a host 8. The host 8 can supply workload data to the processor 2 via an interface 10. There may be a single processor 2, or multiple processors connected on a card and multiple cards in a rack. The processor 2 may be of the type known as an intelligence processor unit (IPU), which is designed to deal with workloads in the field of artificial intelligence or machine learning.

The tiles 3, in the example, are shown arranged in columns. Each of the tiles 3 is connected to a copper wire 12, which provides the clock signal to each of the tiles 3. The copper wire 12 provides a clock tree for the processor 2. The copper wire 12 is selected to be between 0.2 micrometres and 2 micrometres in thickness. The copper wire 12 may, for example, be 1 micrometre thick. The copper wire 12 may be 0.5 micrometres wide. The high thickness of the copper wire 12 reduces the insertion delay of the clock signal, and allows the clock signal to propagate to each of the tiles 3 very rapidly. Having a low insertion delay is advantageous when modifying the clock signal so as to mitigate the droop, since a low insertion delay reduces the amount of time before modifications made to the frequency of the clock signal will take effect at the receiving tiles 3. The insertion delay for such a processor 2 may be approximately 3 nanoseconds.

Furthermore, the thickness of the coper wires 12 allows them to provide an additional function of providing structural support for the processor 2. Hence, the thick copper wires 12 have the dual function of propagating the clock signal and of providing structural support.

Although the processor 2 is shown as a multi-tile processor, in other embodiments, the processor 2 may take different forms. The tiles 3 shown in processor 2 could be other types of components that are clocked by the clock signal, instead of being individual processing units.

The clock signal for the processor 2 is provided by a clock source 4, which provides a clock signal at a first frequency to the processor 2. This clock signal is termed the 'first processor clock signal'. The clock source 4 comprises one or more phase locked loops (PLLs) that provide the first processor clock signal. The one or more phase locked loops may comprise a plurality, e.g. two, PLLs. The clock source 4 may be configured to alternate between providing, as the first processor clock signal, an output of a first PLL (which provides a clock signal of a higher clock speed) and an output of a second PLL (which provides a clock signal of a lower clock speed). The first processor clock signal provided to the processor 2 may be provided to additional processors as well as processor 2. As an alternative to the clock being supplied via a card connector or similar, there may be an on-board clock source. That is, the clock 4 may be implemented within the processor 2.

The clock source 4 provides the first processor clock signal to the droop mitigation circuit 11. When in normal operation, the droop mitigation circuit 11 passes the first processor clock signal through to the processor 2 without modifying the frequency. When droop occurs, the droop mitigation circuit 11 modifies the first processor clock signal to produce a second processor clock signal with a different frequency. The first processor clock signal is modified by removing a proportion of the clock pulses (e.g. 1 in 3) to produce the second processor clock signal. That is, the droop mitigation circuit 11 'eats' a proportion of the clock pulses of the first processor clock signal to produce the second processor clock signal.

The droop mitigation circuit 11 is configured to receive from a droop detector 13, an indication of voltage droop. The droop mitigation circuitry 11 responds to this indication of voltage droop by modifying the first processor clock signal to produce the second processor clock signal. Different possibilities exist as to how the droop detector 13 operates to detect the droop. The droop detector 13 may operate by measuring the power supply voltage directly. Alternatively, the droop detector 13 may operate by measuring a change in the position of an edge of a clock signal (which may be the first processor clock signal) in a detecting apparatus. The change in position of the edge results from the voltage droop and, therefore, provides an indication of the voltage droop.

A power management integrated circuit (PMIC) 7 provides power to the processor 2 through a supply rail. The supply voltage provided at the processor 2 is labelled as $V_{DD}$. The PMIC 7 may also receive an input from the droop detector 13, which indicates to the PMIC 7, the droop in $V_{DD}$. In some cases, the PMIC 7 responds to this indication by raising its output voltage so as to increase $V_{DD}$. This mitigates the droop more slowly than the clock pulse removing process performed by droop mitigation circuit 11, and, furthermore, may reduce power efficiency. However, if the PMIC 7 increases its output voltage, this may allow the frequency of the clock signal to be raised again to increase the execution speed of the processor, whilst still keeping $V_{DD}$ above an acceptable level.

Figure 2:
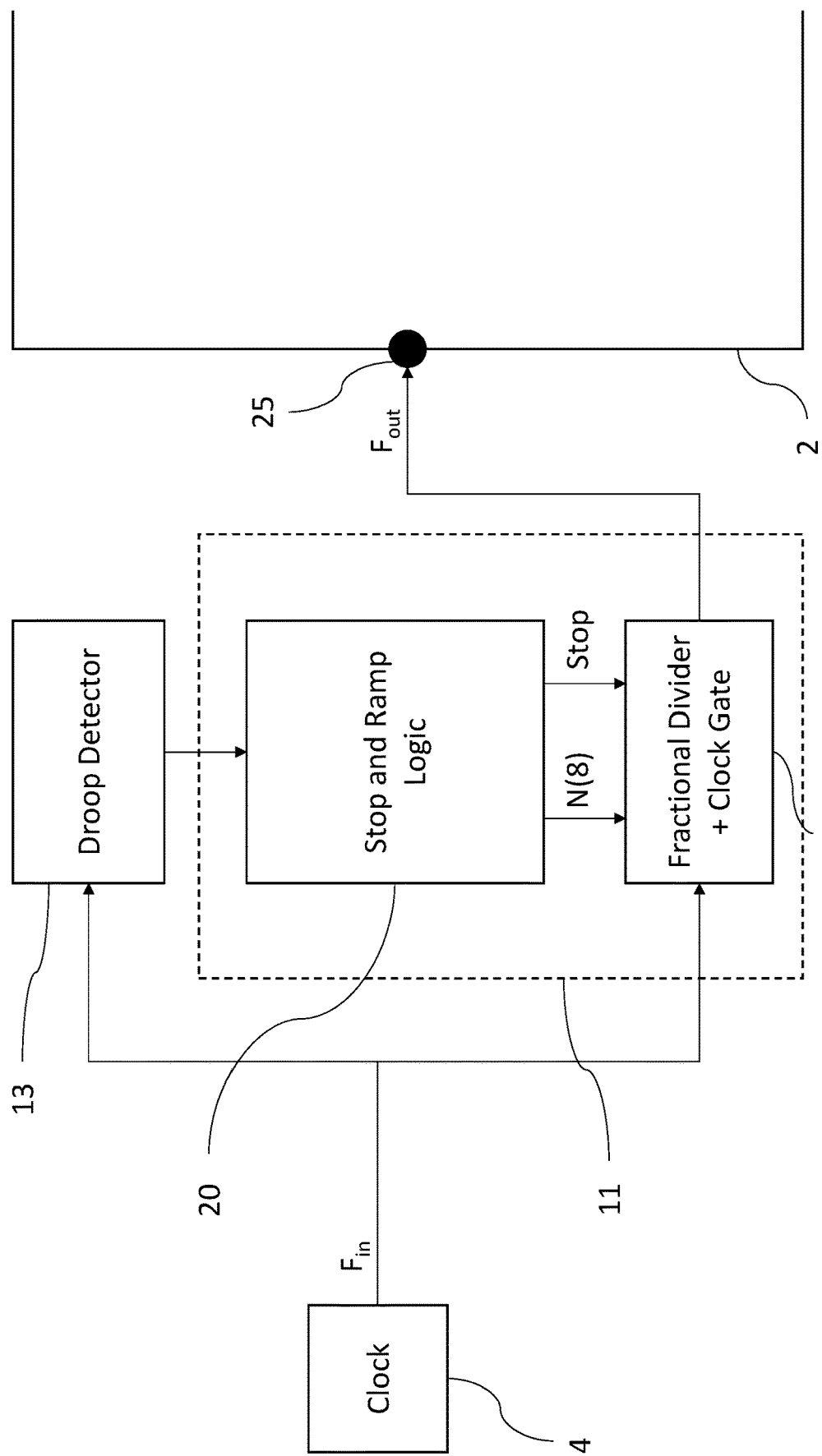
FIG. 2 provides a schematic illustration of the droop detection and mitigation circuitry in which droop is detected by measuring the change in position of a clock signal edge.

Reference is made to FIG. 2, which illustrates in more detail, the droop mitigation circuit 11 and droop detector 13. In this example, the droop detector 13 uses a clock signal (referred to herein as the "first clock signal") to detect the droop by measuring a change in a clock edge position of the first clock signal. In the example shown in FIG. 2, the first clock signal, for which the clock edge position is measured, is the same as the first processor clock signal that is used to clock the processor 2. However, in other embodiments, different clock signals may be used for these purposes.

The droop mitigation circuitry 11 comprises stop and ramp logic 20 and circuitry 21. The circuitry 21 provides a fractional dividing function, in which a portion of the clock pulses are removed from the first processor clock signal, and a clockgating function, in which the first processor clock signal is blocked for a predefined number of clock pulses. The stop and ramp logic 20 may otherwise be referred to as a 'controller'. The circuitry 21 may be referred to as 'clock signal modification circuitry'.

During normal operation, prior to the detection of droop rising above a threshold level, the first processor clock signal passes through the circuitry 21 and is provided to the processor 2 without modification by the circuitry 21. In normal operation, therefore, the second processor clock signal has the same frequency as the first processor clock signal.

The droop detector 13 issues an indication of droop to the stop and ramp logic 20. The stop and ramp logic 20 determines whether this droop has exceeded a threshold. If the stop and ramp logic 20 determines that the level of detected droop exceeds the threshold, it signals the circuitry 21, which responds by performing mitigating action.

As a first, optional mitigating step, the stop and ramp logic 20 issues a stop signal to the circuitry 21. The circuitry 21, in response to the stop signal, blocks the first processor clock signal from being sent to the processor 2. The first processor clock signal is blocked for a predefined number of clock pulses. The predefined number of clock pulses depends upon the insertion delay of the processor 2. The circuitry 21 blocks the first processor clock signal for an amount of time that approximately matches the insertion delay of the processor 2. Matching the insertion delay of the processor 2 in this manner allows the clock to be restarted once the droop mitigation provided by stopping the clock starts to take effect. Stopping the clock mitigates the droop by causing the impedance of the processor 2 to rise, hence increasing the potential difference $V_{DD}$ across the processor 2. After the clock has been blocked for a predefined number of pulses, the stop and ramp logic 20 withdraws the stop signal, and the circuitry 21 unblocks the first processor clock signal in response, so that clock pulses are again provided to processor 2.

The stop and ramp logic 20 provides to the circuitry 21, an indication of a proportion of the clock pulses that should be removed from the first processor clock signal to produce the second processor clock signal. The circuitry 21, in response to the indication of the proportion of clock signals that should be removed, removes the proportion of clock pulses in the first signal to produce the lower frequency second processor clock signal. Therefore, when the first processor clock signal is unblocked following the first step, the unblocked clock signal is provided at a lower frequency.

The indication of the proportion of clock signal to be removed from the first processor clock signal comprises an 8-bit number shown as N(8) in FIG. 2. This number, N, indicates that a proportion of clock signals is to be removed such that:

$$F_{out} = \frac{N}{256} F_{in} \quad \text{Equation 3}$$

where $F_{out}$ is the frequency of the second processor clock signal, and $F_{in}$ is the frequency of the first processor clock signal. The indication of the proportion of clock pulses to be removed may, for example, be such that 1 in every 3 clock pulses are removed by circuitry 21.

Figure 4:
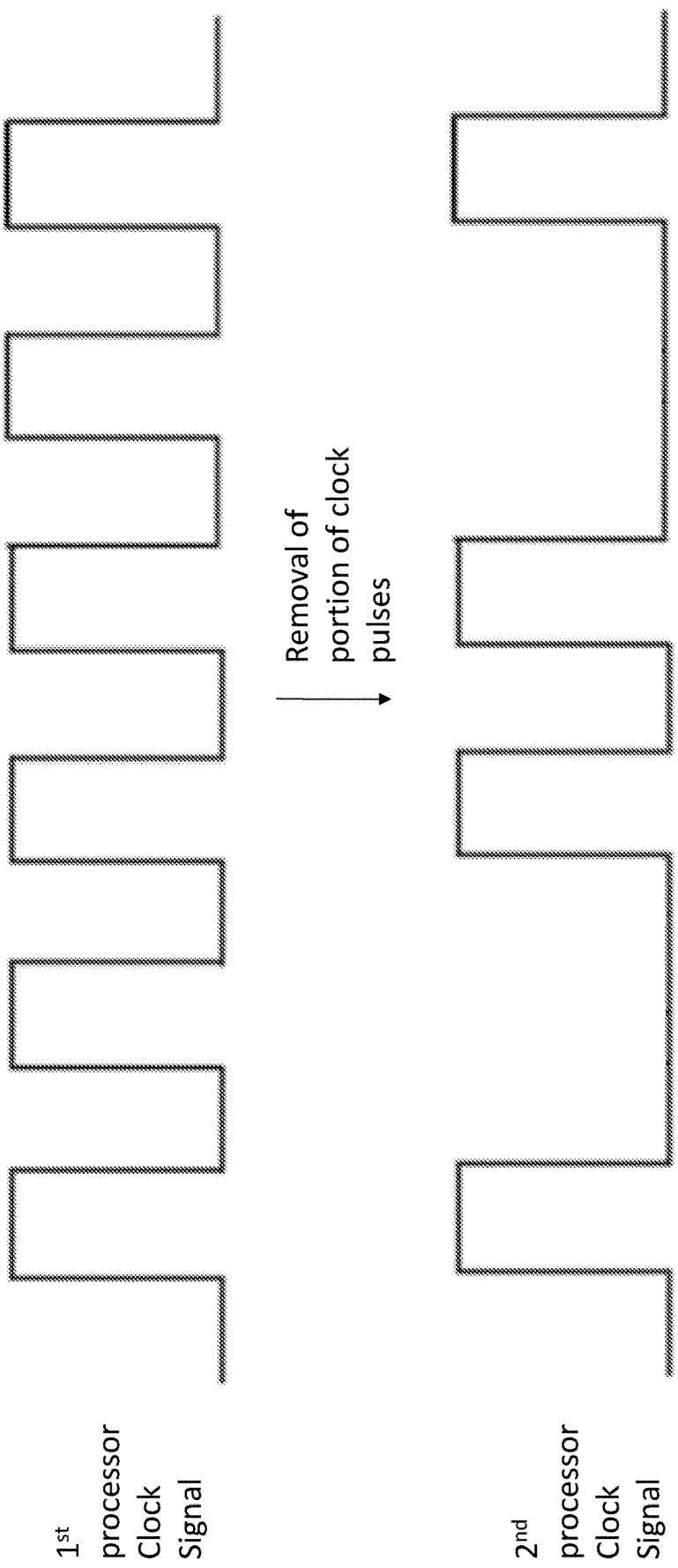
FIG. 4 shows an example modification made to the clock signal to reduce the frequency.

Reference is made to FIG. 4, which illustrates how the second processor clock signal may be related to the first processor clock signal. As shown in FIG. 4, after modification by the circuitry 21, the second processor clock signal is produced with one out of every three clock pulses of the first processor clock signal removed. As is understood from the Figure, removal of the clock pulses means that the signal remains low (i.e. 0) at the time of the removed clock pulses.

The indication of droop that is provided by the droop detector 13 comprises an indication of the magnitude of the droop. This indication of the magnitude of the droop is provided to the stop and ramp logic 20. The stop and ramp logic 20 receives the indication of magnitude of the droop, and in dependence upon the magnitude of the droop determines the proportion of clock pulses to be removed from the first processor clock signal. The proportion of clock pulses to be removed is selected to be proportional to the magnitude of the detected droop.

Following the setting of the circuitry 21 to remove a portion of the clock pulses from the first processor clock signal, the droop mitigation circuitry 11 starts to decrease the proportion of clock pulses removed from the first processor clock signal. In other words, the frequency of the second processor clock signal is gradually increased. This is performed by the stop and ramp logic 20 gradually increasing the value of N that is signalled to the circuitry 21, such that the circuitry 21 gradually removes a smaller proportion of the clock signals from the first processor clock signal. Raising the frequency in this manner is desirable, so as to allow applications executing on the processor 2 to execute faster.

The raising of the frequency may be carried out responsive to updated measurements carried out by the droop detector 13 as to the magnitude of the droop. Indications of the magnitude of the droop may periodically be provided to stop and ramp logic 20 by the droop detector 13.

When the circuitry 21 initially reduces the frequency of the second processor clock signal following detection of the droop, the frequency of the second processor clock signal may be held at this lower level until the droop detector 13 indicates a magnitude of the droop that does not exceed a threshold defined by the stop and ramp logic 20. In response to the determination that the droop does not exceed the threshold, the stop and ramp logic 20 then starts to reduce the proportion of the clock pulses removed from the first processor clock signal. The stop and ramp logic 20 continues to reduce the proportion of the clocks pulses removed from the first processor clock signal as long as the magnitude of the droop remains above the threshold. Hence, the frequency is gradually increased to a higher level as long as the droop remains below a threshold level. The stop and ramp logic 20 reduces the proportion of the clock pulses removed from the first processor clock signal by sending updated values of the variable, N, to the circuitry 21. The circuitry 21 responds by removing a smaller proportion of the clock pulses from the first processor clock signal. Eventually, if the droop remains above the threshold, the frequency of the second processor clock signal will equal the frequency of the first processor clock signal.

There are different variables stored in the stop and ramp logic 20 that affect its operation in controlling the droop. These variables are adjustable as needed. One such variable is the droop threshold. If the droop rises above this threshold, the droop mitigation action will be carried out. If the droop falls below this threshold, the proportion of clock pulses removed will be reduced as long as the droop remains below the threshold. Another one of the variables is the number of clock pulses to be blocked when taking the first mitigating action discussed above. Another of the variables is the rate at which the clock frequency is increased (i.e. by reducing the number of removed clock pulses) following the mitigating action.

The droop detector 13 and droop mitigation circuitry 11 are positioned at the entry point 25 of the processor 2, which receives the clock signal. By positioning the detector 13 and circuitry 11 at the entry point 25, it is ensured the modified clock signal is applied all of the components of the processor 2, whilst also minimising the time between the signal being modified and the modified signal reaching the processor components.

Figure 3:
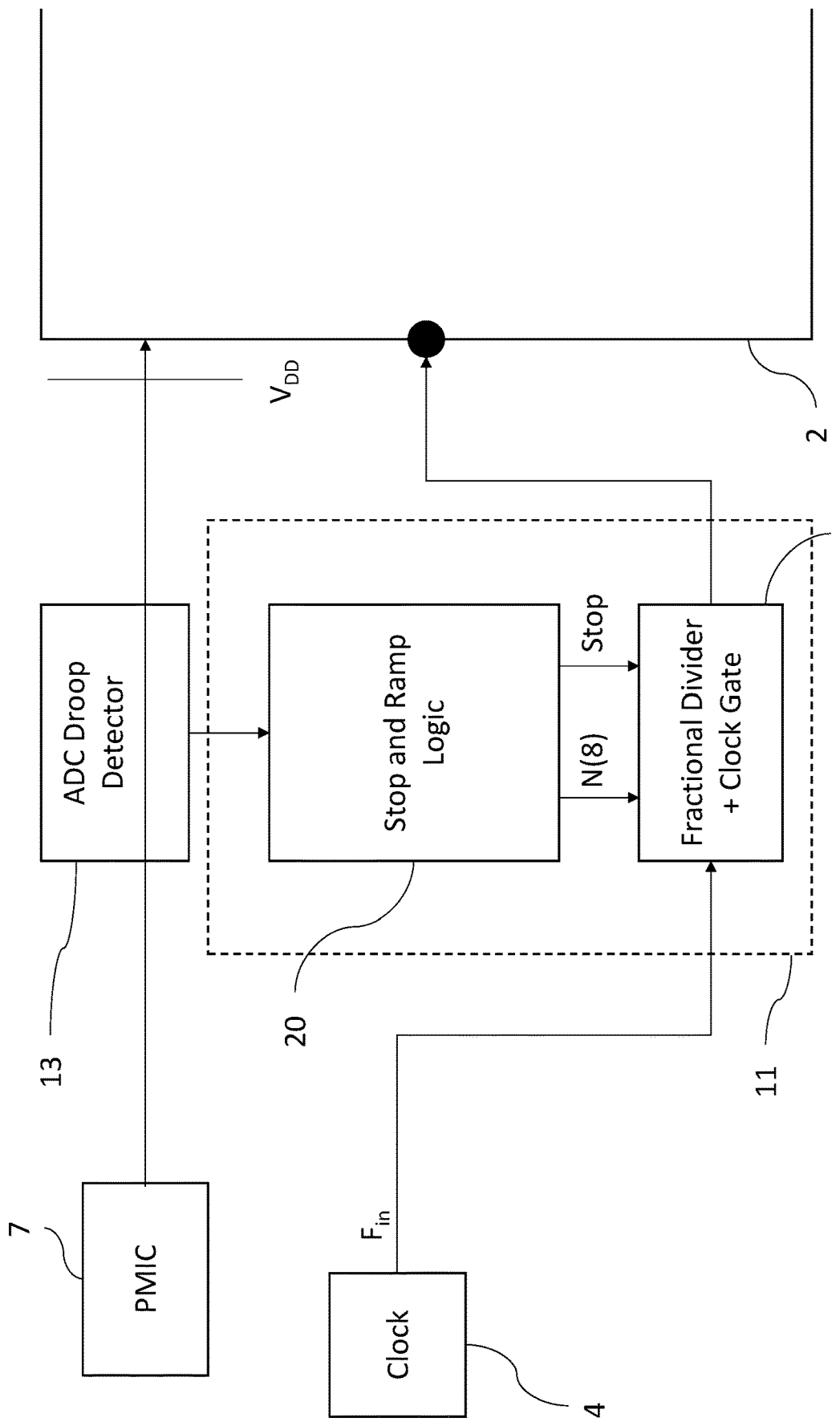
FIG. 3 provides a schematic illustration of the droop detection and mitigation circuitry in which droop is detected by measuring the voltage directly.

Reference is made to FIG. 3, which illustrates the droop mitigation apparatus using a different type of droop detector 13. In this example, the droop detector 13 measures the voltage provided to the processor 2 directly. This droop detector 13 comprises one or more analog to digital convertors that produce measurements of the voltage and report these measurements to the stop and ramp logic 20. The analog to digital convertor, like the tap sampled delay line, provides rapid detection of the droop. However, the tap sampled delay line is a cheaper alternative for detecting the droop. The remaining elements shown in FIG. 3 will operate in the same manner as described above with respect to FIG. 2.

Figure 5:
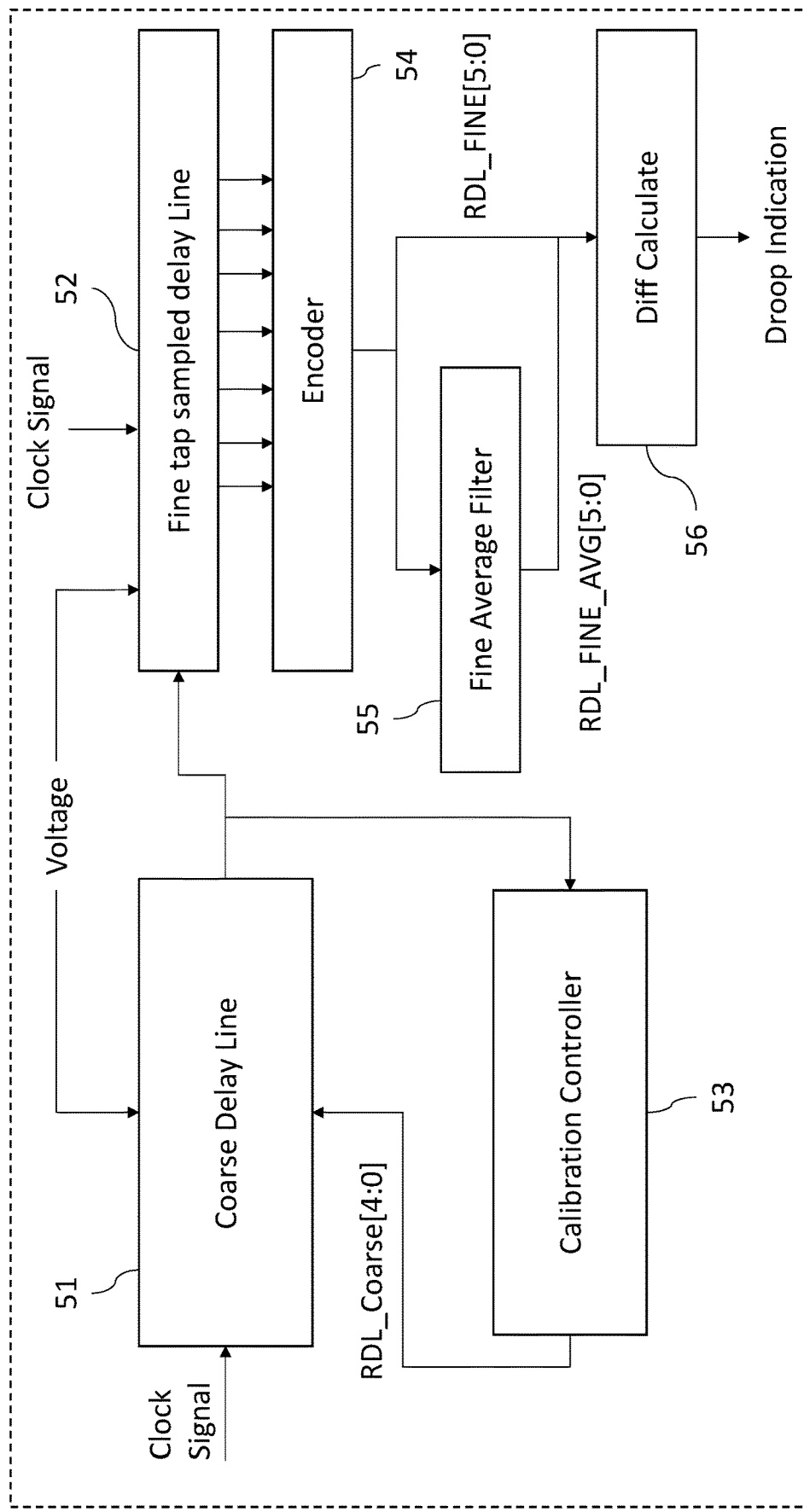
FIG. 5 shows an example of the droop detector for detecting droop by measuring the change in position of a clock signal edge.

Reference is made to FIG. 5, which illustrates an example of a droop detector 13 comprising delay lines for detecting voltage droop. This droop detector 13 measures the droop by measuring a change in position in an edge of a clock pulse in a tap sampled delay line 52. The detector 13 includes a coarse delay line 51 in addition to the fine tap sampled delay line 52. These delay lines 51, 52 operate together to measure the position of an edge of a clock signal, referred to herein as the "first clock signal". The coarse delay line 51 and fine tap sampled delay line 52 are both powered using the same voltage supply that is applied to the processor 2. Therefore, changes in $V_{DD}$ at the processor 2 will coincide with changes in the voltage applied to the coarse delay line 51 and fine tap sampled delay line 52. The delay lines 51, 52 are such that the time taken for a signal to propagate through each stage (i.e. the delay associated with each stage) is dependent upon the voltage supplied to them. The lower the voltage supplied to the delay lines 51, 52, the longer the delay associated with each stage of the delay lines 51, 52. Therefore, since the delay associated with each stage depends upon the supplied voltage, the edge of the first clock signal will move in response to a change in the voltage. By measuring the position of the edge of the first clock signal and comparing it to an average position, a change in the position of the edge of the first clock signal may be detected. The change in the position of the edge of the first clock signal indicates a change in $V_{DD}$.

The coarse delay line 51 is configured to introduce a delay into the first clock signal by a certain amount. The coarse delay line 51 comprises a plurality of stages, each of which may either be activated to apply a delay to the signal, or not activated so as not to apply such a delay to the signal. For example, the coarse delay line may comprise 32 stages, each of which may introduce a delay into the first clock signal of approximately 40 picoseconds. However, the precise amount of the delay depends upon the voltage supplied to the coarse delay line 51. Whether or not each stage is enabled or disabled to introduce its delay is controlled by the calibration controller 53, which outputs an indication of the number of stages in the coarse delay line 51 that are to be active to introduce a delay into the signal. This indication is shown as a 5 bit value 'RDL_Coarse[4:0]' in the Figure.

Figure 6:
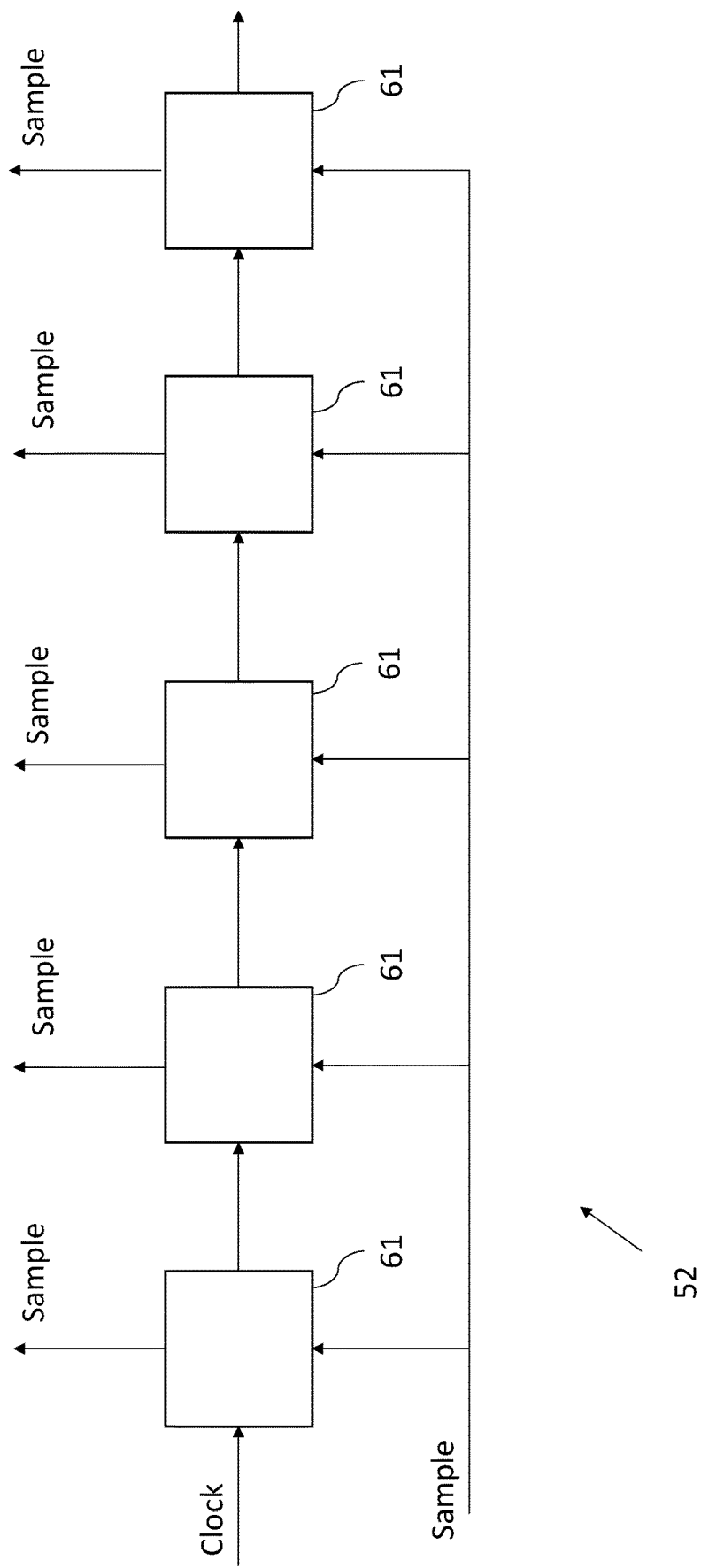
FIG. 6 illustrates a simplified example of a fine tap sampled delay line for detecting the position of a clock signal edge.

The fine tap sampled delay line 52 comprises a plurality of stages, each of which introduces a delay into the first clock signal. The first clock signal is extracted from the fine tap sampled delay line 52 at each stage, such that different samples of the first clock signal at different phases of the first clock signal are extracted. Reference is made to FIG. 6, which is a simplified illustration of a tap sampled delay line 52 that can be used to measure a change in a clock edge position. The tap sampled delay line 52 comprises a series of stages 61, each of which introduces a delay of a predefined magnitude into the first clock signal. Each of the stages 61 may comprise a tap in the form of one or more flip flops that is configured to receive the first clock signal, temporarily hold the value of the first clock signal upon receipt, and output the first clock signal with a predefined delay after receipt. A sample signal is used to cause each of the taps in the delay line 52 to latch a value of the first clock signal at their respective stage 61, such that samples of the first clock signal at different points in the signal are produced.

The sample signal that is used to sample the first clock signal is the same as the first clock signal that is sampled, but without the delays introduced by the coarse delay line 51 and the fine tap sampled delay line 52. In other words, the first clock signal represents a delayed form of the sample clock signal that is derived from the same clock source. The first clock signal and the sample clock signal have the same frequency, but are offset in phase from one another sufficiently by the delay lines to enable the sample clock signal to be used to sample for a position of a rising edge of the first clock signal. The coarse delay line 51 is used to delay the first clock signal by an amount such that, when a rising edge of the sample clock signal arrives at the fine tap sampled delay line 52 causing the fine tap sampled delay line 52 to be sampled at each tap, the previous rising edge of the same clock signal is located in the fine tap sampled delay line 52. In this way, when the sampling is performed, the position of the rising clock edge may be detected and its change in position measured as the voltage varies.

Figure 7:
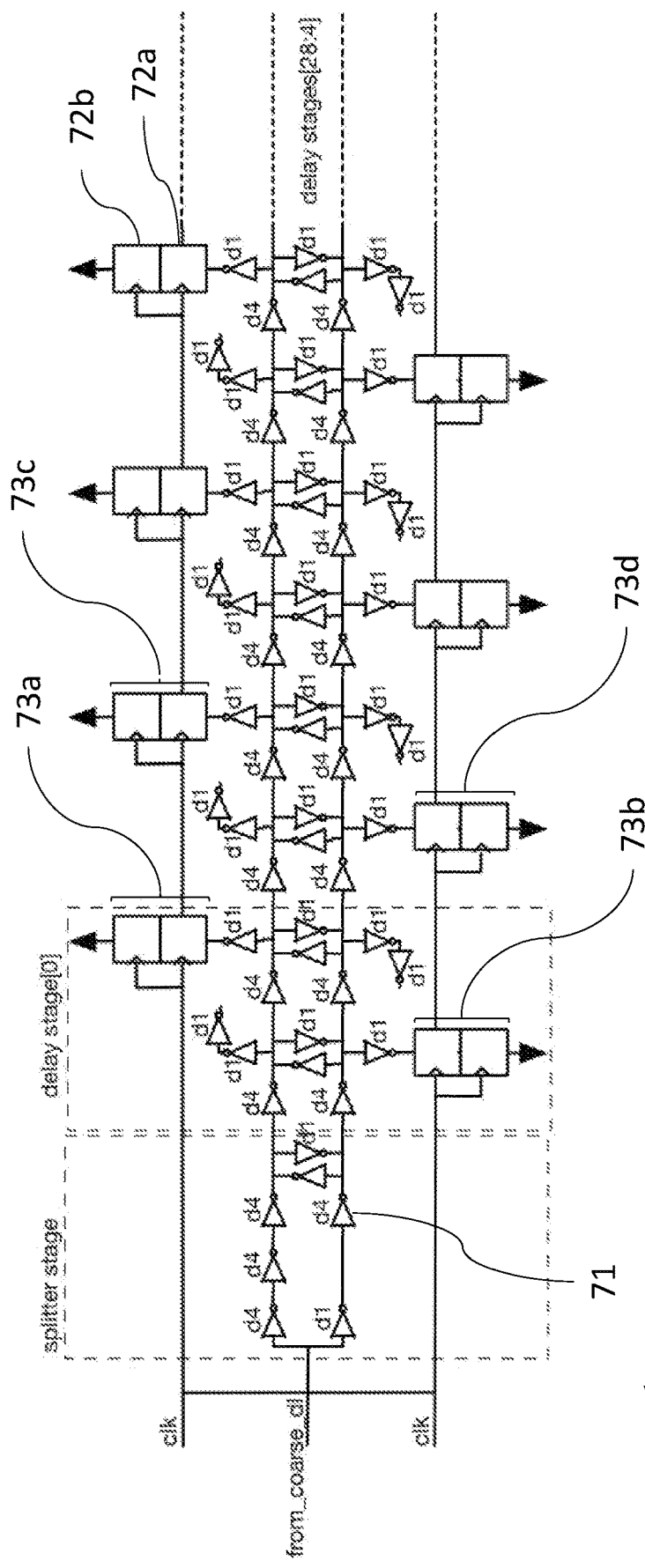
FIG. 7 illustrates an example of a fine tap sampled delay line for detecting the position of a clock signal edge.

The coarse delay line 51 is useful for allowing the fine tap sample delay line 52 to be made shorter and/or finer. In some embodiments, the coarse delay line 51 may be omitted from the droop detector 13, with all of the delay required to detect the previous rising edge of the clock signal being introduced by the fine tap sampled delay line 52. However, this requires that the fine tap sampled delay line 52 be made sufficiently long and/or coarse enough to introduce the required delay, such that an earlier rising edge of the clock signal is present in the fine tap sampled delay line 52 when the subsequent rising edge is received. Reference is made to FIG. 7, which illustrates in more detail, an example as to how the fine tap sampled delay line 52 may operate. As shown, the fine tap sampled delay line 52 comprises a plurality of inverters, which are used to delay the first clock signal. One such inverter is labelled as inverter 71 in FIG. 7. Each such inverter may introduce a delay of approximately 10 ps into the first clock signal. In addition to the inverters used to delay the first clock signal, the fine tap sampled delay line 52 comprises a plurality of flip flops used to sample the first clock signal. One such flip flop is labelled as flip flop 72 in FIG. 7. Each flip flop is configured to receive the first clock signal and a sample clock signal. The flip flop will latch a value of the first clock signal in response to receipt of a rising edge of the sample clock signal. As shown, at each point at which the first clock signal is sampled, there are two flip flops. As will be discussed in more detail later, the presence of two flip flops allows metastability to be resolved at the same time as enabling frequent measurements of the clock edge position to be made.

Each of the inverters, in addition to introducing a time delay, causes the inversion of the first clock signal. If a single chain of inverters is used, with a sample taken after each inverter, half of the samples will be sampling for a rising edge and half for a falling edge. Whilst a sample tap delay may be implemented with additional circuitry to account for the differences in sampling between flip flops, this arrangement may have effects on the timing of the sampling and may reduce the precision with which the clock edge may be detected.

In embodiments, in the fine tap sampled delay line 52, the first clock signal is split along two different paths. The first path is associated with a first set of flip flops for sampling a first instance of the first clock signal in that path, whilst a second path is associated with a second set of flip flops for sampling a second instance of the first clock signal in that path. The clock signal in the first path is inverted compared to the clock signal in the second path. Along the first path, a sample is taken every two inverters along the path. Along the second path, a sample is also taken every two inverters along the path. The result is that each sample taken in the fine tap sampled delay line 52 is a single inverter delay apart, whilst at the same time each tap is sampling for a positive edge.

As shown in FIG. 7, the first clock signal, which in examples is received from the coarse delay line 51 as discussed, is received at the splitter stage of the fine tap sampled delay line 52. At this stage, the clock signal is split along two differential paths. A first of these paths includes three inverters as part of the splitter stage, whilst a second of the paths includes two inverters as part of the splitter stage. As a result, the instance of the first clock signal in the first path is inverted with respect to the instance of the first clock signal in the second path.

At a first delay stage, the clock signal along the second path is sampled by one of a pair of flip flops 73b having inputs connected to the second path. Likewise, the clock signal along the first path is sampled by one of a pair of flip flops 73a having inputs connected to the first path. At the next stage shown, the clock signal along the first path is sampled by one of a pair of a flip flops 73c. Also, at this stage, the clock signal along the second path is sampled by one of a pair of a flip flops 73d. The pair of flip flops 73c is separated from the pair of flip flops 73a by two inverters delays. Likewise, the pair of flip flops 73d is separated from the pair of flip flops 73b by two inverters delays. Therefore, along each of the lines, two inverter delays separate each of the taps (i.e. pairs of flip flops) at which a measurement is taken upon a rising edge of the sample clock signal being received. However, the combination of making measurements of the differential clock signal along the two lines allows a set of samples to be provided, where each sample is separated by only a single inverter delay.

As shown in FIG. 7, the first clock path and the second clock path are connected at repeated points by a pair of inverters. These inverters are positioned back to back and are used to convert the signal propagating on the first clock path to match that on the second clock path and vis versa. This keeps the clock signal propagating along the two clock paths differential, preventing the two signals on the two clock paths from drifting apart.

As already discussed, at each tap in the fine tap sampled delay line 52, a pair of flip flops, rather than a single flip flop, is provided. This allows for metastability to be resolved without reducing the sampling rate of the detector 13. Metastability can occur in a flip flop if that flip flop samples the first clock signal on a clock edge. In this case, the first clock signal, when sampled, is not high or low, but has an intermediate level that is between the two. Since the flip flops are configured to be bistable, i.e. stable when storing either a high or a low value, a flip flop cannot store a value representing the intermediate level indefinitely. Therefore, when the first clock signal is sampled on a clock edge, the flip flop temporarily enters a metastable state. If the flip flop is read when in a metastable state, the logic into which it is read could produce confusing or conflicting results.

After a certain period of time, the flip flop will fall into one of its two stable states. To reduce the probability that the result read from the fine tap sampled delay line 51 will be read from a metastable flip flop that has not yet been resolved into one its two stable states, a second set of flip flops is used to sample the values latched in the first set of flip flops on a next rising edge of the sample clock cycle. By following this procedure, sufficient time will have elapsed by the time that the second set of flip flops are read, such that all of the flip flops of the second set will be in one of their two stable states.

For example, consider the flip flops 72a, 72b. When a rising edge of the sample clock signal is received at the flip flop 72a, the flip flop 72a latches the input value of the first clock signal at the point on the clock path to which it is connected. If, when the sampling occurs, the first clock signal has a rising edge at the input to the flip flop 72a, the flip flop 72a may enter a metastable state. When the next rising edge of the sample clock signal is received at the flip flop 72b, the output of flip flop 72a is latched in flip flop 72b. The flip flop 72a meanwhile latches the next sample value of the first clock signal. Since one clock cycle elapses between the first clock signal being previously sampled, and that respective sample value being latched into the flip flop 72b, an extra clock cycle is provided for resolving metastability. When the flip flop 72b is read to provide one of the samples output from the delay line 52, metastability will likely have been resolved, with the output of the flip flop 72b being one of the two stable states (i.e. either high or low).

The same technique for resolving metastability described with respect to flip flops 72a, 72b is applied for the remaining pairs of flip flops in the fine tap sampled delay line 52.

In order to increase the positive feedback in the flip flops, and thereby increase the speed at which flip flops resolve from a metastable state into one of the two stable states, each of the flip flops comprises ultra-low VT (voltage threshold) transistors. By constructing the flip flops with such transistors, the positive feedback of the transistors is increased, reducing the amount of time taken for the flip flops to arrive at stable states.

Referring again to FIG. 5, the samples outputs from the taps in the fine tap sampled delay line 52 are provided to an encoder 54, which is configured to determine based on the output of the fine tap sampled delay line 52, the position of the clock edge. The position of the clock edge is determined from the output of the fine tap sampled delay line 52 by examining the samples to determine between which of the two samples a transition between a high (i.e. 1) and a low (i.e. 0) occurs in the signal. The clock edge is then determined to be between these two points. The output of the encoder 54 (shown as RDL_FINE[5:0]) indicates the position of the clock edge. Since the fine tap sampled delay line 52 outputs 64 samples, the output contains 6 bits, with these bits indicating in which gap between two samples, the clock edge occurred.

The output indicating the position of the clock edge is provided to the fine average filter 55. The fine average filter 55 receives different output values from the encoder 54 and averages these values over time to produce an average value (shown as RDL_FINE_AVG[5:0]) for a detected position of the clock edge. The average value output by the filter is updated each time a new clock edge position value is output by the encoder 54. The average value output by filter 55 is provided to the difference calculation circuitry 56, which determines the difference between the clock edge position and the average clock edge position. This difference represents the shift in the clock edge caused by the magnitude of the droop. The difference indicates the magnitude of the droop.

This droop indication is provided by the droop detector to the stop and ramp logic 20 as shown in FIG. 2.

Figure 8:
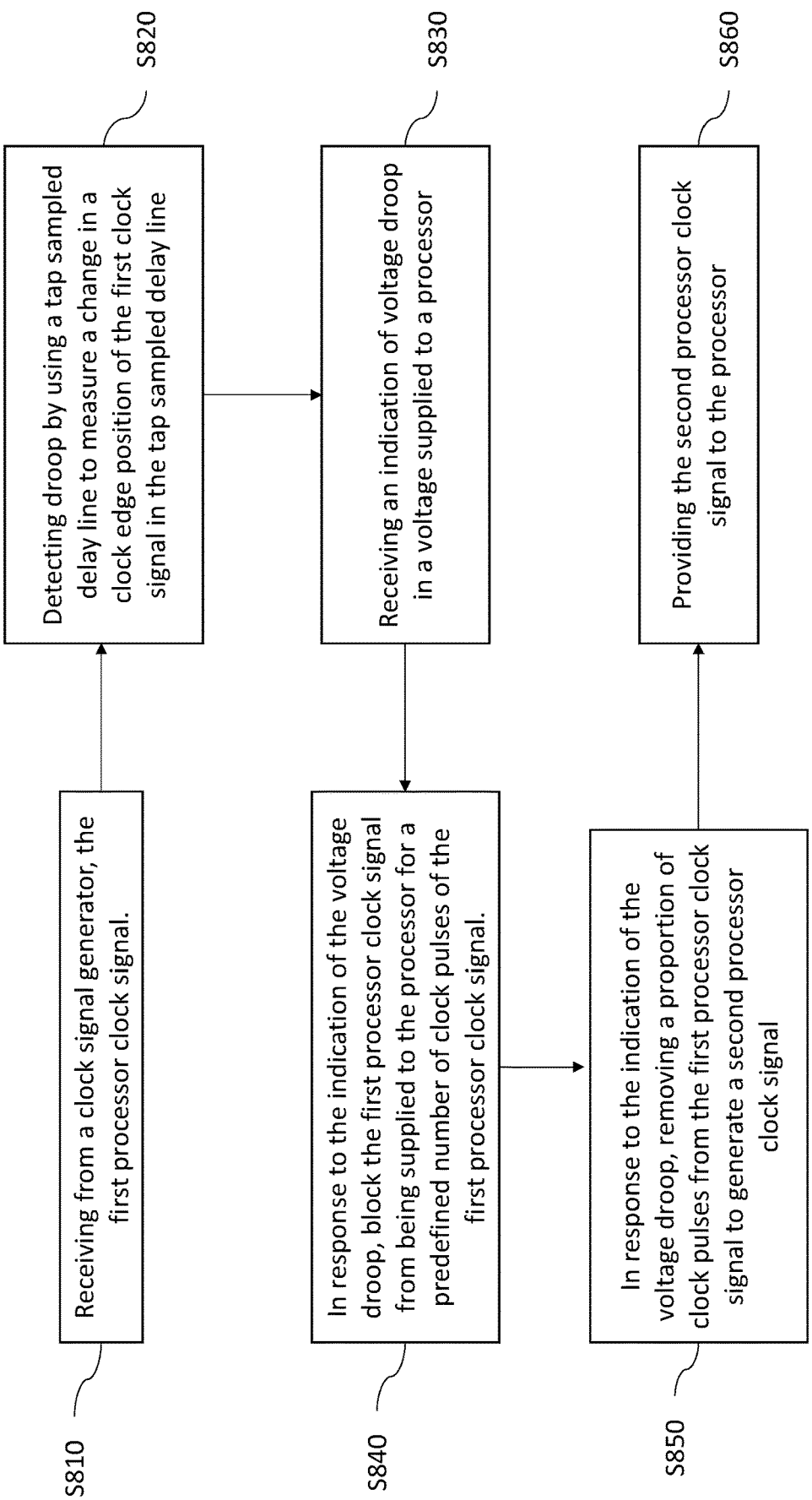
FIG. 8 illustrates an example of a method according to embodiments of the application.

Reference is made to FIG. 8, which illustrates a method 800 according to example embodiments.

At S810, the droop mitigation circuitry receives from a clock signal generator, the first processor clock signal.

At S820, the droop detector detects voltage droop by using a tap sampled delay line to measure a change in a clock edge position of the first clock signal in the tap sampled delay line.

At S830, the droop mitigation circuitry receives from the droop detector, an indication of voltage droop in $V_{DD}$.

At S840, in response to the indication of the voltage droop, the droop mitigation circuitry, in response to the indication of the voltage droop, blocks the first processor clock signal from being supplied to the processor for a predefined number of clock pulses of the first processor clock signal.

At S850, in response to the indication of the voltage droop, the droop mitigation circuitry removes a proportion of clock pulses from the first processor clock signal to generate a second processor clock signal.

At S860, the droop mitigation circuitry provides the second processor clock signal to the processor.

Figure 9:
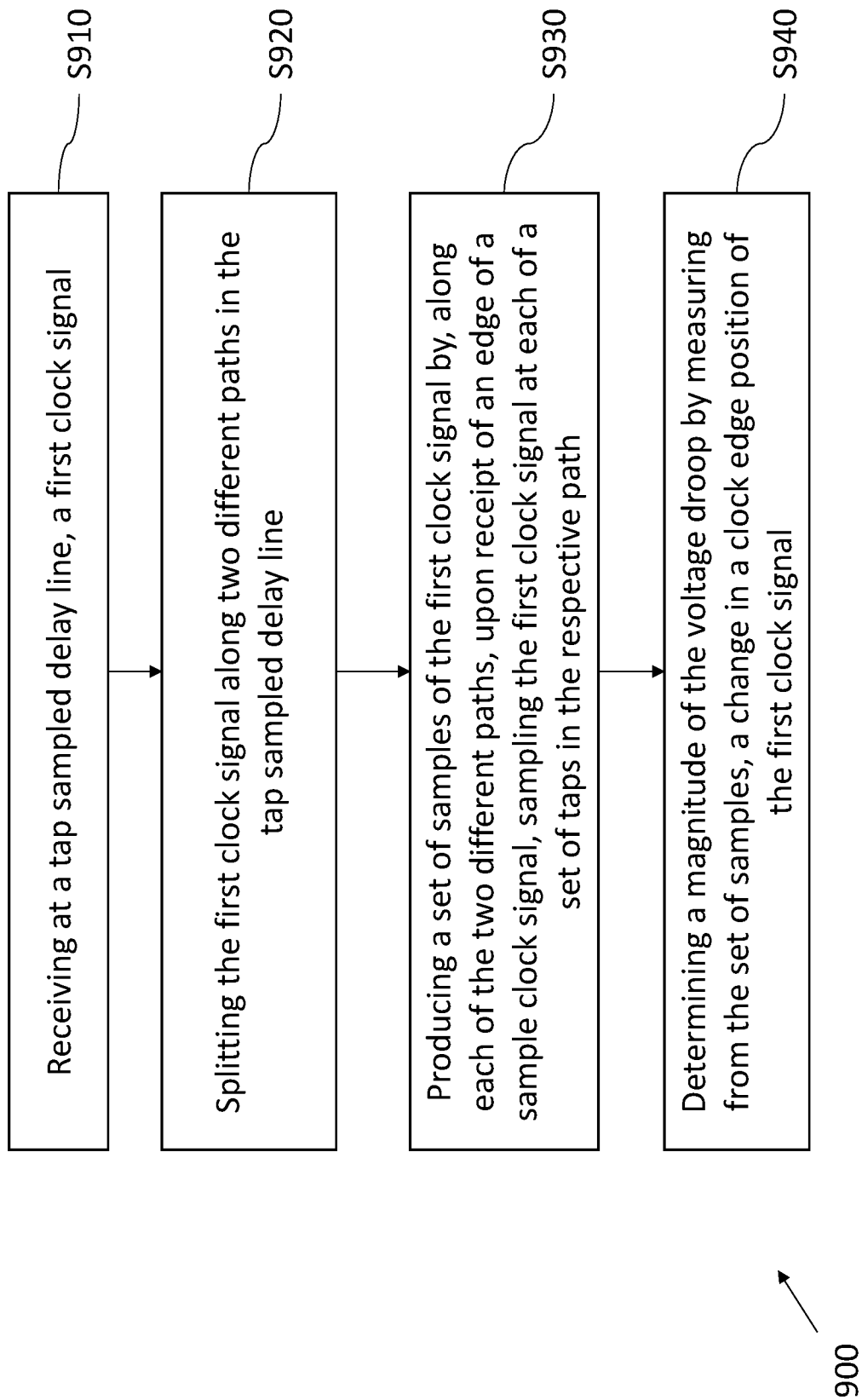
FIG. 9 illustrates an example of a method for detecting droop according to embodiments of the application.

Reference is made to FIG. 9, which illustrates a method 900 for detecting droop according to example embodiments.

At S910, the tap sampled delay line receives the first clock signal.

At S920, the first clock signal is split along two different paths in the tap sampled delay line.

At S930, the tap sampled delay line produces a set of samples of the first clock signal by, along each of the two different paths, upon receipt of an edge of a sample clock signal, sampling the first clock signal at each of a set of taps in the respective path.

At S940, a magnitude of the voltage droop is determined by measuring from the set of samples, a change in a clock edge position of the first clock signal.

While particular embodiments have been described, other applications and variants of the disclosed techniques may become apparent to a person skilled in the art once given the disclosure herein.

The invention claimed is:

1. A method for reactively limiting voltage droop, the method comprising:
 providing from a clock generator, a first processor clock signal to a processor for clocking the processor, the first processor clock signal being of a first frequency;
 measuring a voltage supplied to the processor to determine an indication of the voltage droop in a voltage supplied to the processor, including measuring a change in a clock edge position of a first clock signal in a tap sampled delay line, wherein the tap sampled delay line is powered by a same power supply that supplies the voltage supplied to the processor;
 in response to the indication of the voltage droop, generating a second processor clock signal of a second frequency, wherein the second frequency is lower than the first frequency; and
 providing the second processor clock signal to the processor for clocking the processor,
 wherein the measuring the change in the clock edge position of the first clock signal in the tap sampled delay line comprises:
  producing a set of samples of the first clock signal upon receipt of an edge of a sample clock signal at the tap sampled delay line; and
  determining, from the set of samples, the change in the clock edge position of the first clock signal.

2. The method of claim 1, wherein generating the second processor clock signal comprises:
 determining from the indication of the voltage droop that the voltage droop exceeds a threshold; and
 in response to the voltage droop exceeding the threshold, removing a proportion of clock pulses from the first processor clock signal.

3. The method of claim 2, wherein the proportion of clock pulses is dependent upon a magnitude of the voltage droop contained in the indication of the voltage droop.

4. The method of claim 1, wherein the second frequency ($F_{out}$) is related to the first frequency ($F_{in}$) by:

$$F_{out} = \frac{N}{256} F_{in}$$

wherein N is an integer.

5. The method of claim 1, comprising:
 propagating the second processor clock signal along copper wires of the processor for clocking a plurality of components of the processor.

6. The method of claim 5, wherein the copper wires have a thickness of greater than 0.2 micrometres.

7. The method of claim 5, wherein the plurality of components comprises a plurality of processing units.

8. The method of claim 1, wherein the first clock signal comprises a delayed version of the sample clock signal.

9. A computer system comprising:
 a processor;
 a clock generator coupled to the processor and configured to provide a first processor clock signal for clocking the processor, the first processor clock signal having a first frequency; and
 clock signal modification circuitry configured to, in response to a voltage droop, generate a second processor clock signal of a second frequency, wherein the second frequency is lower than the first frequency and configured to provide the second processor clock signal to the processor for clocking the processor;
 wherein the clock signal modification circuitry comprises means for detecting the voltage droop by measuring a change in a clock edge position of a first clock signal in a tap sampled delay line, including:
  means for producing a set of samples of the first clock signal upon receipt of an edge of a sample clock signal at the tap sampled delay line; and
  means for determining, from the set of samples, the change in the clock edge position of the first clock signal.

10. The computer system of claim 9, further comprising:
 means for determining that the voltage droop exceeds a threshold;
 means for providing an indication that the threshold is exceeded; and
 means for removing a proportion of clock pulses in response to the indication that the threshold is exceeded.

11. The computer system of claim 10, wherein the indication that the threshold is exceeded comprises an indication of the proportion of clock pulses.

12. The computer system of claim 9, wherein the processor is configured to propagate the second processor clock signal along copper wires of the processor for clocking a plurality of components of the processor.

13. The computer system of claim 12, wherein the plurality of components comprises a plurality of processing units.

14. The computer system of claim 9, wherein the clock signal modification circuitry is located at an entry point of the second processor clock signal to the processor.

15. A method comprising:
providing from a clock generator, a first processor clock signal to a processor for clocking the processor, the first processor clock signal being of a first frequency;
detecting a voltage droop in a voltage supplied to the processor, including measuring a change in a clock edge position of a first clock signal in a tap sampled delay line, wherein measuring the change in the clock edge position comprises:
producing a set of samples of the first clock signal upon receipt of an edge of a sample clock signal at the tap sampled delay line, wherein the first clock signal comprises a delayed version of the sample clock signal;
determining, from the set of samples, the change in the clock edge position of the first clock signal;
prior to measuring the change in the clock edge position, receiving the sample clock signal at a further delay line having coarser delay stages than the tap sampled delay line; and
delaying, by the coarser delay stages, the sample clock signal by an amount such that, when a rising edge of the sample clock signal arrives at the tap sampled delay line, a previous rising edge of the sample clock signal is located in the tap sampled delay line;
in response to detecting the voltage droop, generating a second processor clock signal of a second frequency, wherein the second frequency is lower than the first frequency; and
providing the second processor clock signal to the processor for clocking the processor.

16. The method of claim 15, wherein generating the second processor clock signal comprises:
determining that the voltage droop exceeds a threshold; and
in response to the voltage droop exceeding the threshold, removing a proportion of clock pulses from the first processor clock signal.

17. The method of claim 16, wherein the proportion of clock pulses is dependent upon a magnitude of the voltage droop.

18. The method of claim 16, further comprising:
subsequent to removing the proportion of clock pulses, adjusting the second processor clock signal to increase the second frequency, including decreasing the proportion of clock pulses removed from the first processor clock signal.

19. The method of claim 15, comprising receiving the second processor clock signal at the processor;
propagating the second processor clock signal along wires of the processor for clocking a plurality of components of the processor.

20. The method of claim 19, wherein the plurality of components of the processor comprises a plurality of processing units.

* * * * *